(12) United States Patent
Widener

(10) Patent No.: US 9,625,506 B2
(45) Date of Patent: Apr. 18, 2017

(54) CONTACTLESS RESISTANCE MEASUREMENT

(71) Applicant: Texas Instruments Incorporated, Dallas, TX (US)

(72) Inventor: Steven Rowland Widener, Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 243 days.

(21) Appl. No.: 14/250,825

(22) Filed: Apr. 11, 2014

(65) Prior Publication Data

US 2015/0293158 A1    Oct. 15, 2015

(51) Int. Cl.
*G01R 27/00* (2006.01)
*G01R 27/02* (2006.01)
*G01K 1/02* (2006.01)
*G01K 7/22* (2006.01)

(52) U.S. Cl.
CPC ............. *G01R 27/02* (2013.01); *G01K 1/024* (2013.01); *G01K 7/22* (2013.01)

(58) Field of Classification Search
CPC ...... G01R 27/00; G01R 27/02; G01R 27/025; G01R 27/08; G01R 27/10; G01R 31/2813; G01R 35/00; G01R 35/005
See application file for complete search history.

(56) References Cited

U.S. PATENT DOCUMENTS

| | | | |
|---|---|---|---|
| 3,699,800 A | 10/1972 | Waldron | |
| 4,973,912 A * | 11/1990 | Kaminski | B60R 21/0173 324/652 |
| 6,657,439 B1 * | 12/2003 | Harada | G01R 27/08 324/600 |
| 2005/0156604 A1 * | 7/2005 | Red'ko | G01N 27/023 324/439 |

FOREIGN PATENT DOCUMENTS

| | | |
|---|---|---|
| CA | 2861689 A1 | 7/2013 |
| RU | 2453854 C1 | 6/2012 |

OTHER PUBLICATIONS

"LDC1000 Inductance-to-Digital Converter", Datasheet, Texas Instruments Incorporated, Jul. 16, 2013, Version 2.3, Rev. 1.11, 20 pages.
"AMC 1200/AMC1200B Fully Differential Isolation Amplifier", Datasheet, Texas Instruments Incorporated, Sep. 2013, 27 pages.
"AN-298 Isolation Techniques for Signal Conditioning", Application Report, Texas Instruments Incorporated, May 2013, 11 pages.

(Continued)

*Primary Examiner* — Son Le
(74) *Attorney, Agent, or Firm* — William B. Kempler; Charles A. Brill; Frank D. Cimino

(57) ABSTRACT

A resistance is measured without physical contact/connection to the resistance. A resistive element to be measured is provided, physically connected as part of a passive electrical circuit. Without physically contacting the resistive element, an electromagnetic field is used to produce an excitation in the passive electrical circuit. The resistance of the resistive (Continued)

element is determined based on an effect of the excitation on the electromagnetic field.

18 Claims, 3 Drawing Sheets

(56) References Cited

OTHER PUBLICATIONS

"IL300 Linear Optocoupler", Datasheet, Vishay Semiconductors, Rev. 1.7, Sep. 23, 2011, 11 pages.
"Measure Your Floating Voltages", Electronic Design, May 5, 2010, http://electronicdesign.com/power/measure-your-floating-dc-voltages.
"ACPL-C87B, ACPL-C87A, ACPL-C870 Precision Optically Isolated Voltage Sensor", Datasheet, Avago Technologies, Mar. 4, 2013, 14 pages.
A Revolution in Sensing: World's First Inductance-to-Digital Converter, "LDC1000 Inductance-to-Digital Converter," Texas Instruments Incorporated, 2013 (pp. 1-7).
Search Report for PCT/US15/25584, mailed Jul. 16, 2015 (1 page).

\* cited by examiner

CONTACTLESS RESISTANCE MEASUREMENT

FIELD

The present work relates generally to measuring electrical parameters and, more particularly, to contactless measurement of resistance.

BACKGROUND

There are numerous circumstances where contactless measurement of a resistance, from a remote measurement position across a gap of material (or air) from the resistance, is desirable. One example is measuring a thermistor resistance buried in a completely sealed device (e.g., a Li-ion battery pack). Contactless measurement (also referred to herein as non-contact measurement) of this resistance can provide information (correlated to temperature) needed for operational qualification and protection of the remote system. Numerous other applications employ thermistors that are not practically accessible through contacts, e.g., fluid temperature measurements in automotive applications, and rotating machinery such as motor windings.

Another example is resistance measurement for configuration control. If a resistor buried within a product is measured by an external contactless system, the measurement result can provide an indication of product configuration. For example, if a resistor embedded in a high volume product has resistance indicative of unique information such as lot code, authentication, expiration date, or other parametric information (such number of battery cells, container size, lot calibration information), then measurement of that resistance identifies the parameter(s).

There are other situations where contact measurements of resistance are possible, but problematic. One example is measuring the resistance of medical fluids. For instance, the resistance of a blood/reagent mixture (e.g., blood/glucose mixture) can be correlated to useful information (e.g., blood/glucose level) about the blood. The resistance measurement is conventionally performed by depositing the mixture on a test strip that is then inserted into a meter via a connector. The meter uses current sources and voltage measurements to determine the resistance of the blood/reagent mixture. However, after enough test cycles, the connector is prone to contamination and eventual failure. Significant material and process costs are required in order to make the connector interface between test strip and meter connector interface sufficiently robust to ameliorate the contamination/failure problem. Cost-effective contactless measurement of the blood/reagent mixture resistance could beneficially eliminate the need for the connector interface.

Although there are known techniques for making contactless voltage measurements, there is not currently available a technique to implement contactless resistance measurements, much less to do so in a simple and cost-effective manner.

It is desirable in view of the foregoing to provide for simple and cost-effective contactless measurement of resistance.

DETAILED DESCRIPTION

Example embodiments of the present work exploit capabilities of the LDC1000 Inductance-to-Digital Converter. This conventional measurement device is commercially available from Texas Instruments Incorporated, and its corresponding Datasheet is submitted herewith and incorporated herein by reference. The LDC1000 is designed for measurement of eddy current losses to support positional and proximity measurements. The present work recognizes that the LDC1000 may be used to obtain accurate, contactless measurements of a remote resistance as described in detail below.

Figure 1:
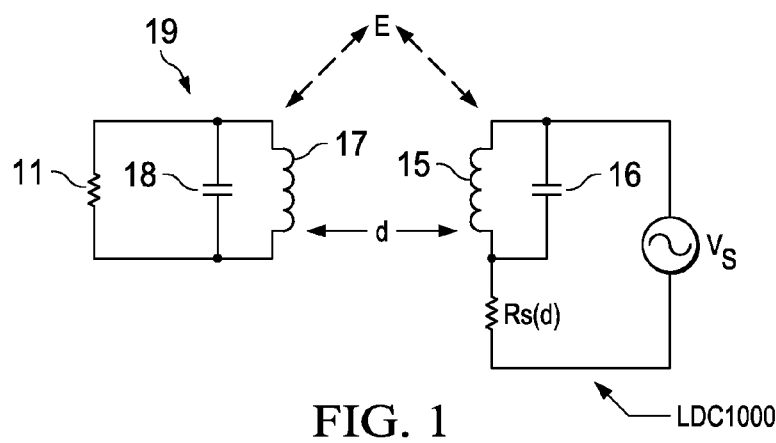
FIG. 1 diagrammatically illustrates circuitry used for non-contact resistance measurement according to example embodiments of the present work.

Referencing FIG. 1, and as described in the Datasheet, the LDC1000 makes a measurement of a "virtual resistance" Rs(d) that is associated with eddy current losses in a metal target (not shown in FIG. 1) located at a distance apart from the LDC1000. The LDC1000 controls the operation of voltage source Vs, thereby producing an electromagnetic field E as a function of inductor 15 and capacitor 16. The field E generates eddy currents in the aforementioned metal target, and the LDC1000 measures energy injected back into the inductor/capacitor arrangement 15/16 due to changes in the field E caused by the eddy currents.

Example embodiments of the present work utilize an inductor 17 and (optionally) a tuned capacitor 18 connected in parallel with the remote resistive element 11 that is to be measured without contact, to form a passive electrical circuit 19. So, for example, the entire passive circuit 19 would be embedded in a high volume product instead of just the resistance 11. In some embodiments, inductor 17 is the same construction as (i.e., identical to) inductor 15, and capacitor 18 is the same as capacitor 16. The LDC1000 may be used in the same manner as described in the Datasheet, but with the aforementioned metal target replaced by the passive circuit 19 as shown in FIG. 1. In conventional use of the LDC1000, a "PROXIMITY" reading is produced by the LDC1000's graphical user interface (GUI) companion software, and this reading corresponds to the aforementioned eddy current losses in the metal target. According to example embodiments of the present work, the PROXIMITY reading produced by the GUI software correlates to the resistance of the resistive element 11.

Figure 2:
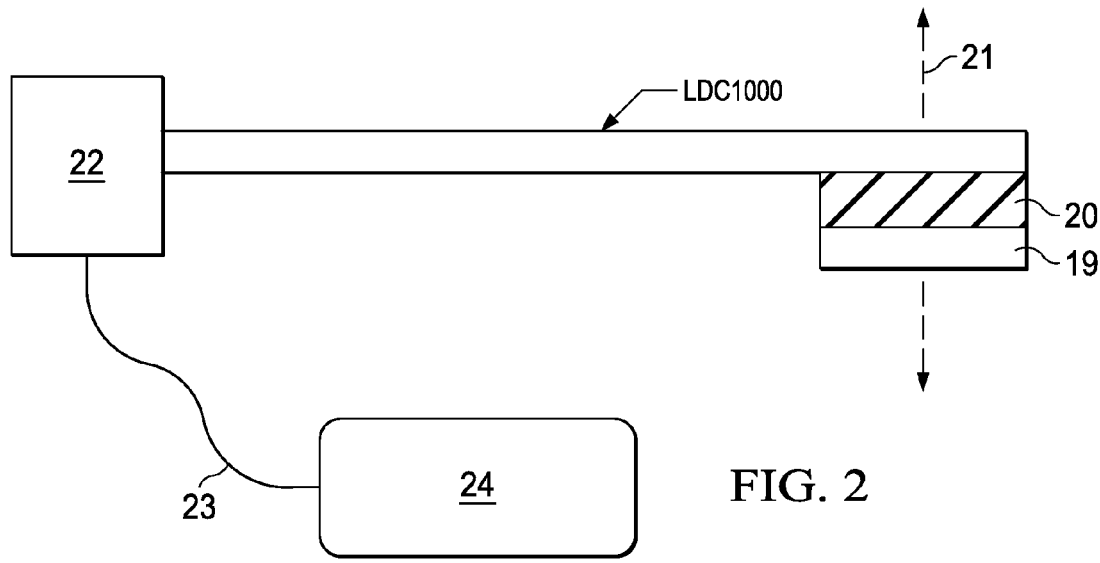
FIG. 2 diagrammatically illustrates an arrangement that supports non-contact measurement of resistance according to example embodiments of the present work.

FIG. 2 diagrammatically illustrates an arrangement that supports contactless remote measurement of resistance according to example embodiments of the present work. The arrangement of FIG. 2 maintains a predetermined positional relationship between the LDC1000 and the passive circuit 19 (embedded in an enclosing material in some embodiments). As shown, some embodiments use a variable spacer 20 (e.g., a polycarbonate material) that maintains the LDC1000 and the passive circuit 19 separated by a selected spacer distance (see also d in FIG. 1), with the winding axes of the inductors 15 and 17 maintained in substantially coaxial alignment with one another, as shown generally by axis 21. Numerous suitable techniques and structures are conventionally available for use in effecting and maintaining the aforementioned predetermined positional relationship, and their application for such purposes is well within ordinary skill in the art. The LDC1000 is connected to a suitable computer 24 via a suitable connector 22 and cable 23 assembly. In some embodiments, the computer 24 is a desktop or laptop personal computer, and the cable/connector assembly 22/23 is a USB assembly.

The LDC1000 is capable of providing its PROXIMITY reading to its companion GUI software on the computer 24. The variable spacer 20 permits collection of PROXIMITY readings for a plurality of known separation distances (see d in FIG. 1) between the LDC1000 inductor 15 and the inductor 17 of the passive circuit 19. For a given distance and unknown resistance 11, the PROXIMITY reading can be evaluated relative to corresponding test data, namely, PROXIMITY readings taken at the same distance for a plurality of different known resistances. By this evaluation, the resistance of the resistive element 11 may be determined (or interpolated or inferred).

In some embodiments, the aforementioned test data is collected by providing a passive circuit having inductor 17 (and optionally capacitor 18) connected in parallel with a variable resistance. With the LDC1000 and the passive circuit separated by a selected distance, PROXIMITY readings are taken for a plurality of different known resistances. The process may then be repeated for each of a plurality of different separation distances.

Figure 3:
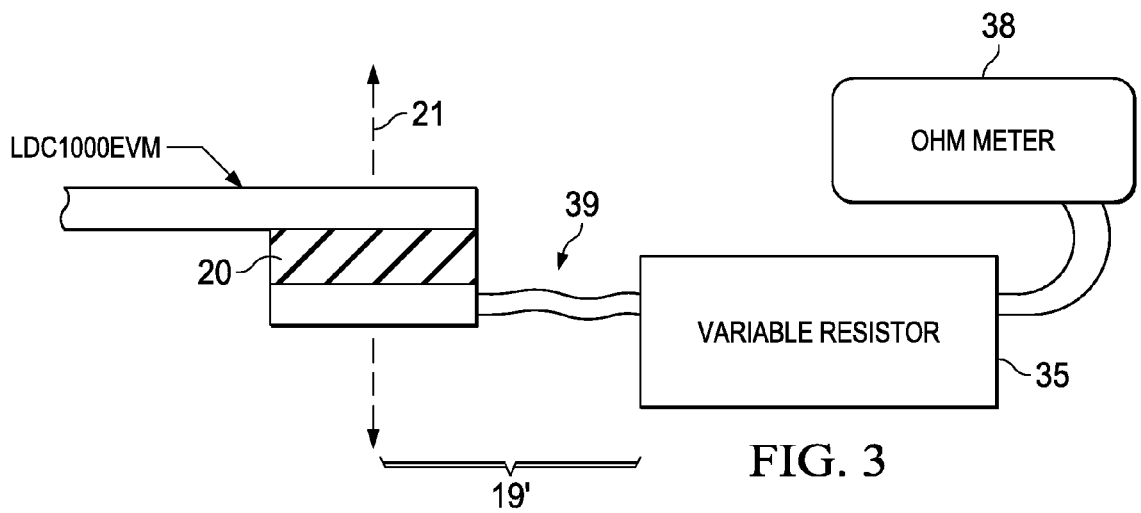
FIG. 3 diagrammatically illustrates an arrangement that supports test data collection according to example embodiments of the present work.

FIG. 3 diagrammatically illustrates an arrangement that supports test data collection according to example embodiments of the present work. In some embodiments, the arrangement of FIG. 3 is the same as FIG. 2, except that a variable resistor 35 (e.g., a potentiometer in some embodiments) replaces unknown resistance 11 in passive circuit 19 (see FIGS. 1 and 2). The variable resistor 35 is arranged in parallel with inductor 17 (and capacitor 18 in some embodiments) to construct a "test" passive circuit for test data collection. This "test" passive circuit is designated generally by 19' in FIG. 3. The variable resistor 35 can provide a plurality of known resistance values for use in test data collection. As shown in FIG. 3, the variable resistor 35 is removably connected into the passive circuit 19' by suitably disconnectable jumper wires 39, and is also removably connected to an ohm meter 38 by similar disconnectable jumper wires. This permits the variable resistor 35 to be removed from the "test" passive circuit 19', then connected to the ohm meter 38, then set to a desired resistance using the ohm meter 38, then disconnected from the ohm meter 38, and then reconnected into the passive circuit 19' for a test measurement.

For calibration purposes, some embodiments provide a "calibration" passive circuit that is constructed the same as the passive circuit 19 in the actual product whose resistance will be measured (e.g., configured as in FIG. 1 and embedded in a high volume product), but containing one of the aforementioned "known" resistance values (e.g., 10 K ohms +/−1%) in place of the unknown resistance 11 of FIG. 1. This "calibration" passive circuit is disposed to be nearly co-located with the passive circuit 19 (see FIGS. 1 and 2) that is provided in the actual product and whose resistance 11 is unknown. Measurements of the known resistance of the calibration circuit, which known resistance is also measured during the aforementioned test data collection, provides an opportunity to determine a calibration relationship to be applied between measurements of the unknown resistance and measurements of known resistances taken during test data collection. In this manner there may be effected reductions in the impacts of factors such as variability in coupling, nearby metal objects and, more generally, differences between operating conditions in effect during test data collection and operating conditions in effect during unknown resistance measurement. Additional description of determining the calibration relationship appears further below.

Figure 4:
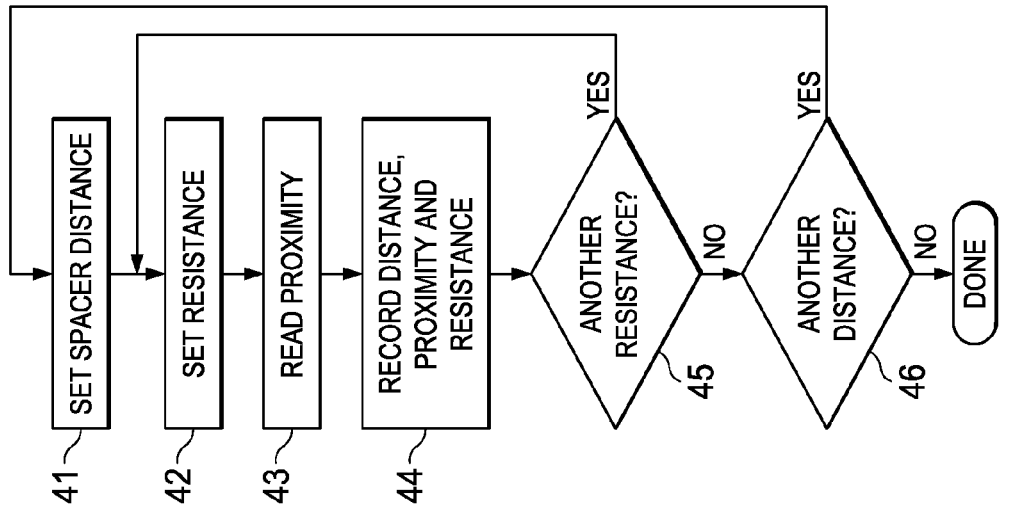
FIG. 4 illustrates test data collection operations according to example embodiments of the present work.

FIG. 4 illustrates test data collection operations described above according to example embodiments of the present work. With the spacer distance set at 41, and the resistance (variable resistor) set at 42, a PROXIMITY reading is taken at 43, and then recorded at 44 together with the spacer distance and resistance. As shown at 45, the operations at 42-44 are repeated for a plurality of different (known) resistances. As shown at 46, the operations at 41-45 are repeated for a plurality of spacer distances.

Figure 5:
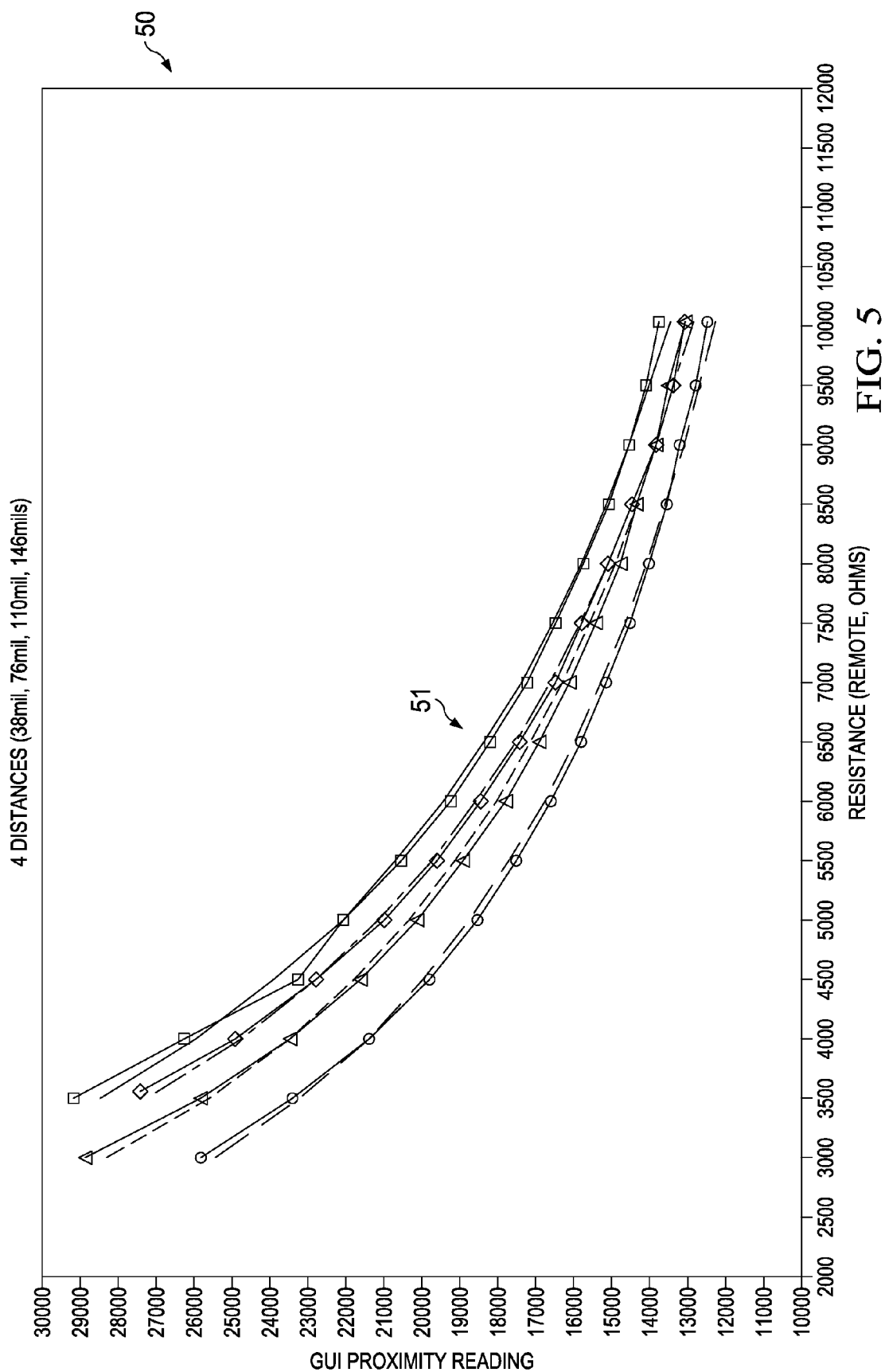
FIG. 5 illustrates graphically a database produced by test data collection operations according to example embodiments of the present work.

After test data collection is completed, the information that has been recorded at 44 provides, for each of a plurality of spacer distances, a plurality of resistances and their respectively corresponding PROXIMITY readings. This information may be used to construct a suitable database (DB) from which a resistance value may be obtained for a given combination of a PROXIMITY reading and a spacer distance. One example of such a database is shown graphically at 50 in FIG. 5, where each of the PROXIMITY versus resistance curves 51 corresponds to a respective one of the noted spacer distances. The leftmost curve corresponds to the largest noted spacer distance (146 mils in the FIG. 5 example), and the spacer distances decrease from left to right, with the rightmost curve corresponding to the smallest noted spacer distance (38 mils in the FIG. 5 example). For a given PROXIMITY reading taken at a given spacer distance, the information provided by the curves 51 may be used to determine the unknown resistance of the resistive element 11.

Figure 6:
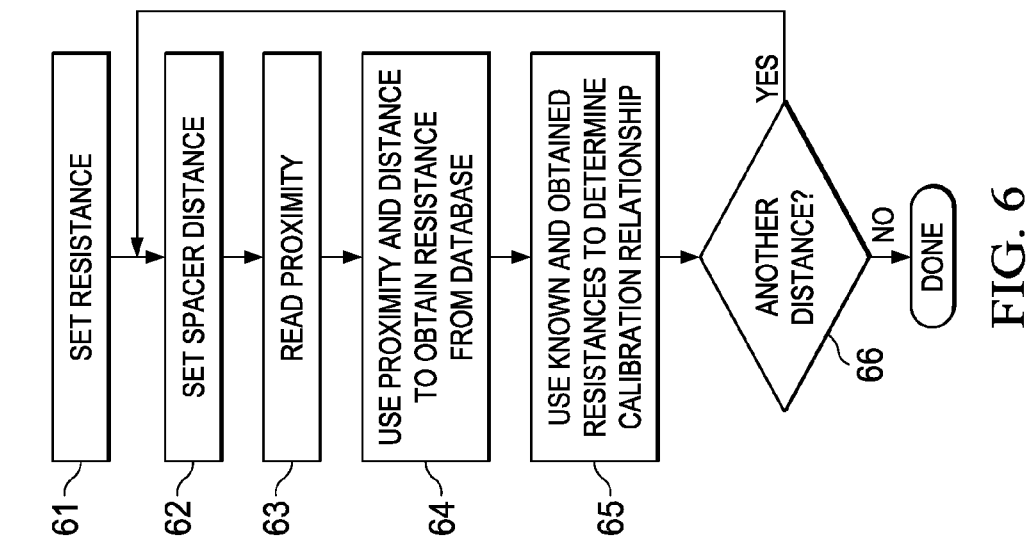
FIG. 6 illustrates operations for obtaining a calibration relationship according to example embodiments of the present work.

FIG. 6 illustrates operations described above for obtaining a calibration relationship according to example embodiments of the present work. At 61, a known resistance is set within a "calibration" passive circuit that is otherwise constructed (e.g., embedded in a product, etc.) the same as the passive circuit 19 containing the unknown resistance 11 (see also FIGS. 1 and 2). The spacer distance is set at 62. A PROXIMITY reading is taken at 63, under operating conditions that approximate, as nearly as is practical, those in which PROXIMITY readings for the unknown resistance are taken. The PROXIMITY reading is used at 64, together with the spacer distance, to obtain the corresponding resistance from the database produced by the operations of FIG. 4. At 65, the known resistance, as set at 61, and the database resistance obtained at 64 are used (e.g., compared) to establish a calibration relationship for resistances measured at the current spacer distance, as set at 62. As shown at 66, the operations at 62-65 may be repeated to obtain calibration relationships for a plurality of spacer distances.

Figure 7:
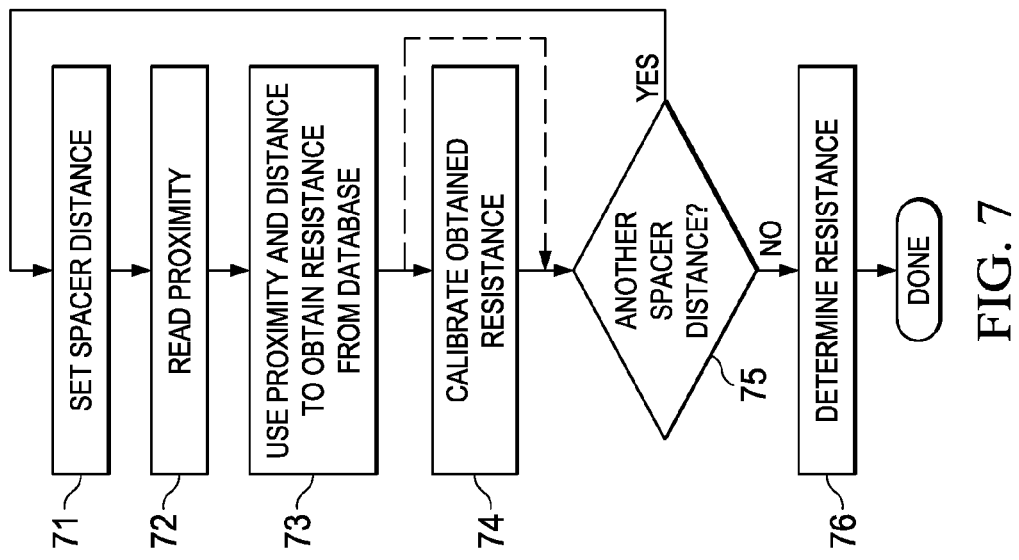
FIG. 7 illustrates non-contact resistance measurement operations according to example embodiments of the present work

FIG. 7 illustrates operations described above for non-contact resistance measurement according to example embodiments of the present work. After setting the spacer distance at 71, a PROXIMITY reading is taken at 72. At 73, the PROXIMITY reading and spacer distance are used to obtain a resistance from the database produced by the operations of FIG. 4. In some embodiments, the obtained resistance is then calibrated at 74, using the calibration relationship produced by the operations of FIG. 6, to produce a calibrated resistance. Some embodiments omit calibration, as shown by broken line. As shown at 75, some embodiments repeat the operations at 71-74 for a plurality of spacer distances. At 76, the desired resistance determination is made. In various embodiments, the determination at 76 is one of: simply a single database resistance value obtained using a singe PROXIMITY reading taken at a single spacer distance; a single calibrated resistance value determined by calibrating a singe database resistance value obtained using a single PROXIMITY reading taken at a single spacer distance; a result of combining (e.g., averaging) a plurality of database resistance values respectively obtained using a plurality of PROXIMITY readings taken respectively at a plurality of spacer distances; and a result of combining (e.g., averaging) a plurality of calibrated resistance values determined respectively by calibrating a plurality of database resistance values respectively obtained using a plurality of PROXIMITY readings taken respectively at a plurality of spacer distances.

In some embodiments that measure thermistor resistances, for each spacer distance used, each of the PROXIMITY readings described above relative to FIGS. 4-7 is taken at a plurality of different temperatures, thereby providing additional information indicative of relationships between PROXIMITY reading, thermistor resistance and temperature.

The LDC1000 is further capable of providing an inductance measurement reading to the GUI software on computer 24 (see FIG. 2), together with its aforementioned PROXIMITY reading. Some embodiments use the inductance measurement to aid in normalizing the aforementioned resistance determinations as a function of spacer distance.

As is evident from the foregoing, the present work provides simple, integrated, low cost non-contact resistance measurement. Example embodiments can be implemented in harsh environments. Other advantages include simple operation; low cost measurement device (e.g., LDC1000); elimination of existing connectors in various products; and enablement of new use-cases without requiring addition of connectors.

Although example embodiments of the present work have been described above in detail, this does not limit the scope of the work, which can be practiced in a variety of embodiments.

What is claimed is:

1. A method for non-contact resistance measurement, comprising:
    providing a resistive element that is physically connected as part of a passive electrical circuit, the passive electrical circuit including an inductor connected in parallel with resistive element;
    without physically contacting the resistive element,
    using an electromagnetic field to produce an excitation in the passive electrical circuit, and
    determining a resistance of the resistive element based on an effect of said excitation on said electromagnetic field, wherein said determining includes evaluating said measurement relative to a plurality of further said measurements, each said further measurement corresponding to a respective further passive electrical circuit, wherein each said further passive electrical circuit has a respective known resistance connected in parallel with a further inductor having an inductance equal to that of said inductor, and wherein each said further passive electrical circuit is maintained, during the corresponding further measurement, in a predetermined positional relationship with the measurement device in order to calibrate a measurement arrangement.

2. The method of claim 1, wherein said using includes maintaining the passive electrical circuit in a predetermined positional relationship relative to a measurement device that produces said electromagnetic field, and wherein said determining includes using the measurement device, during said maintaining, to make a measurement that corresponds to said effect of said excitation on said electromagnetic field.

3. The method of claim 1, wherein said determining includes making a resistance determination for the resistive element based on said evaluating.

4. The method of claim 3, wherein said determining includes making a plurality of said resistance determinations that respectively correspond to a plurality of said predetermined positional relationships, and combining said resistance determinations to obtain a final resistance determination for the resistance element.

5. The method of claim 4, wherein said combining includes averaging said resistance determinations.

6. The method of claim 2, wherein said predetermined positional relationship includes a winding axis of said inductor coaxially aligned with a winding axis of an inductor in the measurement device.

7. The method of claim 6, wherein said predetermined positional relationship includes said measurement device and said passive electrical circuit spaced apart from one another by a predetermined distance.

8. The method of claim 2, wherein said measurement indicates a distance between the passive electrical circuit and the measurement device.

9. The method of claim 2, wherein the measurement device is an LDC1000 inductance-to-digital converter.

10. The method of claim 1, wherein said passive electrical circuit is provided in a thermistor.

11. The method of claim 10, including repeating said using and said determining for a plurality of different temperatures of the thermistor.

12. The method of claim 1, wherein said resistive element includes a blood/reagent mixture.

13. The method of claim 1, wherein said resistive element is provided in a manufactured product and the resistance of said resistive element can be measured by said electromagnetic field to generate a value indicative of unique information associated with an item of information about the manufactured product.

14. The method of claim 1, wherein said passive electrical circuit includes an inductor and a capacitor each connected in parallel with the resistive element.

15. A method for non-contact resistance measurement, comprising:
    providing a resistive element that is physically connected as part of a passive electrical circuit including an inductor connected in parallel with the resistive element;
    without physically contacting the resistive element,
    using an electromagnetic field to produce an excitation in the passive electrical circuit wherein said using includes maintaining the passive electrical circuit in a predetermined positional relationship relative to a measurement device that produces said electromagnetic field, and wherein said determining includes using the measurement device, during said maintaining, to make a measurement that corresponds to said effect of said excitation on said electromagnetic field, and determining a resistance of the resistive element based on an effect of said excitation on said electromagnetic field wherein said determining includes evaluating said measurement relative to a plurality of further said measurements, includes making a resistance determination for the resistive element based on said evaluating, each said further measurement corresponding to a respective further passive electrical circuit, wherein each said further passive electrical circuit has a respective known resistance connected in parallel with a further inductor having an inductance equal to that of said inductor, and wherein each said further passive electrical circuit is maintained, during the corresponding further measurement, in said predetermined positional relationship with the measurement device and including obtaining a calibration relationship for said plurality of further measurements in order to compensate for a difference between first operating conditions associated with said measurement and second operating conditions associated with said plurality of further measurements.

16. The method of claim 15, wherein said calibration relationship is based on another said measurement performed under said first operating conditions and corresponding to one of said further passive electrical circuits, wherein said one of said further passive electrical circuits is, during said another measurement, maintained in said predetermined positional relationship with the measurement device.

17. The method of claim 16, including applying said calibration relationship to the resistance determination in order to obtain a calibrated resistance determination for the resistive element.

18. The method of claim 17, including applying said calibration relationship to a plurality of said resistance determinations that respectively correspond to a plurality of said predetermined positional relationships to obtain a plurality of calibrated resistance determinations, and combining said calibrated resistance determinations to obtain a final resistance determination for the resistive element.

\* \* \* \* \*